US008790531B2

(12) United States Patent
Stern

(10) Patent No.: US 8,790,531 B2
(45) Date of Patent: Jul. 29, 2014

(54) HIGH PURITY, ENVIRONMENTALLY CLEAN METHOD AND APPARATUS, FOR HIGH RATE, LIQUID ANISOTROPIC ETCHING OF SINGLE CRYSTAL SILICON OR ETCHING OF POLYCRYSTALLINE SILICON, USING AN OVERPRESSURE OF AMMONIA GAS ABOVE AQUEOUS AMMONIUM HYDROXIDE

(76) Inventor: Alvin Gabriel Stern, Newton, MA (US)

( * ) Notice: Subject to any disclaimer, the term of this patent is extended or adjusted under 35 U.S.C. 154(b) by 245 days.

(21) Appl. No.: 13/135,567

(22) Filed: Jul. 8, 2011

(65) Prior Publication Data
US 2013/0012028 A1  Jan. 10, 2013

(51) Int. Cl.
| | | |
|---|---|---|
| *C03C 15/00* | (2006.01) | |
| *C03C 25/68* | (2006.01) | |
| *H01L 21/67* | (2006.01) | |
| *H01L 21/306* | (2006.01) | |
| *H01L 21/3213* | (2006.01) | |
| *C09K 13/04* | (2006.01) | |

(52) U.S. Cl.
CPC .... *H01L 21/67086* (2013.01); *H01L 21/30608* (2013.01); *H01L 21/32134* (2013.01); *C09K 13/04* (2013.01)
USPC ................ 216/83; 216/99; 438/689; 438/745

(58) Field of Classification Search
USPC .............. 118/697; 134/1, 1.3, 198, 2, 3, 36; 216/73, 79, 83; 257/437; 438/689, 753, 438/745
See application file for complete search history.

(56) References Cited

U.S. PATENT DOCUMENTS

| | | | | |
|---|---|---|---|---|
| 4,578,137 A | * | 3/1986 | Kring | 156/345.11 |
| 5,575,079 A | * | 11/1996 | Yokomizo et al. | 34/78 |
| 5,803,507 A | * | 9/1998 | Vu | 285/23 |
| 2006/0073673 A1 | * | 4/2006 | Verhaverbeke | 438/455 |
| 2006/0115949 A1 | * | 6/2006 | Zhang et al. | 438/300 |
| 2007/0158308 A1 | * | 7/2007 | Koyata et al. | 216/88 |
| 2008/0096393 A1 | * | 4/2008 | Kim et al. | 438/745 |

FOREIGN PATENT DOCUMENTS

JP  61097837  * 5/1986  ............ H01L 21/306

OTHER PUBLICATIONS

East english translation Abstract of JP 61097837 A.*
Chen et al. Selective etching of silicon in aqueous ammonia solution, 1995, Sensors and Actuators A 49, p. 115-121.*
Ammonium Hydroxide ($NH_4OH$) (CAS #: 1336-21-6) Specification, produced by Spectrum Chemical Co.
(Continued)

*Primary Examiner* — Duy Deo
*Assistant Examiner* — Erin Bergner

(57) ABSTRACT

A high purity, non-toxic, environmentally friendly method for anisotropically etching single crystal silicon and etching polysilicon, suitable for microelectronics, optoelectronics and microelectromechanical (MEMS) device fabrication, using high purity aqueous ammonium hydroxide ($NH_4OH$) solution generated at the point of use, is presented. The apparatus of the present invention supports generation of high purity aqueous $NH_4OH$ solution from ammonia $NH_3$ gas dissolved into distilled/deionized water and maintained in equilibrium with an overpressure of $NH_3$, within a hermetically enclosed chamber at the optimal temperature between 70-90° C., preventing evaporation of $NH_3$ gas from aqueous $NH_4OH$ solution for achieving a high anisotropic etching rate. Other liquid anisotropic etching methods for silicon may use tetramethylammonium hydroxide (TMAH). In contrast to carbon containing TMAH, the $NH_3$ gas and $H_2O$ precursors of $NH_4OH$ etchant eliminate risk for solid residues to be deposited on silicon due to being composed entirely of elements having a gaseous form at room temperature.

9 Claims, 4 Drawing Sheets

(56) References Cited

OTHER PUBLICATIONS

Semiconductor grade deionized water ($H_2O$) (CAS #: 7732-1805) specification, Tianjin Cemtranse.
Ammonia ($NH_3$) (CAS #: 7664-41-7) Specification, Matheson company.
Ammonium Hydroxide ($NH_4OH$) (CAS #: 1336-21-6) Material Safety Data Sheet (MSDS) from Spectrum.
Deionized water ($H_2O$) (CAS #: 7732-18-5) Material Safety Data Sheet (MSDS) from Spectrum.
Ammonia ($NH_3$) (CAS #: 7664-41-7) Material Safety Data Sheet (MSDS) from Matheson.
Alvin G. Stern, "Design of a high sensitivity emitter-detector avalanche photodiode imager using . . . ," Optical Engineering.
Alvin G. Stern, "Design of high quantum efficiency and high resolution, Si/Si Ge Avalanche photodiode Focal plane arrays . . . ," Chapter 12, INTECH.

* cited by examiner

HIGH PURITY, ENVIRONMENTALLY CLEAN METHOD AND APPARATUS, FOR HIGH RATE, LIQUID ANISOTROPIC ETCHING OF SINGLE CRYSTAL SILICON OR ETCHING OF POLYCRYSTALLINE SILICON, USING AN OVERPRESSURE OF AMMONIA GAS ABOVE AQUEOUS AMMONIUM HYDROXIDE

CROSS-REFERENCE TO RELATED APPLICATIONS

Not Applicable

STATEMENT REGARDING FEDERALLY SPONSORED RESEARCH OR DEVELOPMENT

Not Applicable

REFERENCE TO SEQUENCE LISTING, A TABLE, OR A COMPUTER PROGRAM LISTING COMPACT DISC APPENDIX

Not Applicable

BACKGROUND OF THE INVENTION

For the purposes of fabricating electronic, optoelectronic semiconductor and microelectromechanical (MEMS) devices in silicon, it is often necessary to perform liquid anisotropic etching of the silicon through either silicon dioxide ($SiO_2$) or silicon nitride ($Si_3N_4$) masks, whereby the silicon crystal planes such as (100), (110) and (111) planes are etched at different rates. The structures resulting in the silicon following such liquid anisotropic etching processes can consist of pyramidal mesa frustum shapes, inverted pyramidal cavities as well as other geometries. Wet etchants that have been used for etching silicon preferentially along crystallographic planes include aqueous solutions of sodium hydroxide (NaOH), potassium hydroxide (KOH), rubidium hydroxide (RbOH), cesium hydroxide (CsOH). Aqueous solutions of tetramethylammonium hydroxide (TMAH, $(CH_3)_4NOH$) and tetraethylammonium hydroxide ($(C_2H_5)_4NOH$) have also been used for liquid anisotropic etching of silicon. Other substances that are known to etch silicon anisotropically, include ethylene diamine pyrocatechol (EDP) and hydrazine ($N_2H_4$). Each of the aforementioned liquid anisotropic etchants have drawbacks for application in the anisotropic etching of silicon. The alkali metal hydroxides cannot be used for fabricating electronic and optoelectronic silicon devices due to the nature of the alkali metal ion that acts to degrade the silicon dioxide dielectric material properties in MOS and CMOS type structures. The alkali metal hydroxides can therefore only be utilized for liquid anisotropic etching of silicon in MEMS applications. The anisotropic liquid etchant TMAH does not contain alkali metal cations and can be prepared with sufficient purity to support liquid anisotropic etching of silicon for electronic and optoelectronic device applications. The drawbacks of using TMAH include its toxicity, making it difficult to handle as well as difficult to dispose of, falling under the category of a hazardous waste. The liquid anisotropic etchant EDP, is a very effective etchant but extremely corrosive and even more toxic and carcinogenic than TMAH. It has to be treated and disposed of as a hazardous waste which makes it difficult and costly to use. Hydrazine ($N_2H_4$) also functions as a liquid anisotropic etchant for silicon but is extremely corrosive, toxic and carcinogenic, thereby complicating its use and making it costly due to the problem of disposal as a hazardous waste. Moreover, hydrazine is an extremely flammable liquid, having very high energy content, making its principal application as a component in fuels for rocket and jet engines. The existing liquid anisotropic etchants have major drawbacks for application to silicon, with TMAH being the least problematic of the ones described for fabrication of silicon electronic and optoelectronic devices.

The present invention describes a method for implementing liquid anisotropic etching of silicon for the full range of applications including silicon electronic and optoelectronic devices as well as silicon MEMS device fabrication using ammonia ($NH_3$) gas dissolved in high purity deionized water, to form the aqueous base ammonium hydroxide ($NH_4OH$) which acts as the anisotropic etchant. An overpressure of $NH_3$ gas is maintained within the hermetically enclosed etching apparatus, to prevent the dissolved ammonia gas from evaporating from the solution at the elevated temperatures required to effect a high anisotropic etching rate of the silicon in the aqueous $NH_4OH$ solution. The principal advantage of using aqueous $NH_4OH$ over other methods to anisotropically etch silicon includes the capability of preparation in an extremely pure form at the point of use by dissolving ultra high purity (99.9999%) semiconductor grade ammonia ($NH_3$) gas into distilled/deionized water that contains the silicon wafer substrate which must be etched. The ammonium hydroxide anisotropic etching solution, similar to TMAH, EDP and hydrazine, does not contain alkali metal cations and therefore can be used for silicon microelectronic device fabrication as well as for MEMS fabrication. In addition, neither the ammonia gas nor the aqueous ammonium hydroxide ($NH_4OH$) solution are as corrosive, toxic or carcinogenic as TMAH, EDP or hydrazine and therefore, require only normal precautions for handling. The spent aqueous ammonium hydroxide solution can be easily neutralized with a weak acid and does not constitute a hazardous waste, making disposal environmentally friendly and therefore, far less costly to use.

To effectively use aqueous ammonium hydroxide for anisotropic etching of silicon, the solution must be maintained at a temperature between 70-90° C. At these temperatures however, the dissolved ammonia will evaporate rapidly from a solution heated in the open atmosphere, thereby diminishing the concentration of ammonium hydroxide in the aqueous solution and inhibiting the etching action of silicon. To prevent evaporation of ammonia from the aqueous $NH_4OH$ solution at the optimal etching temperature of 70-90° C. and thereby reducing the $NH_4OH$ concentration in solution, an apparatus must contain the etching solution within a hermetically sealed chamber with an overpressure of $NH_3$ gas maintained above the $NH_4OH$ solution at a pressure level above the normal atmospheric pressure. An overpressure of $NH_3$ gas above the $NH_4OH$ liquid anisotropic etching solution that prevents further evaporation of $NH_3$ from the solution can be created in one example approach by dissolving a predetermined weight of ammonia gas into a set volume of deionized water contained in a polytetrafluoroethylene (PTFE) beaker inside the hermetically enclosed pressure chamber at room temperature, to form a fixed and known concentration solution of $NH_4OH$. The temperature of the $NH_4OH$ solution is subsequently raised between 70-90° C. to increase the etch rate of the silicon. Some ammonia will evaporate from the solution at the elevated temperature required for etching, however, the sealed pressure chamber prevents its escape beyond the volume of the apparatus. The pressure in the hermetic chamber increases as more ammonia evaporates from the $NH_4OH$ solution, eventually reaching an equilibrium steady state between the rate of $NH_3$ evaporation from the aqueous $NH_4OH$ solution into the enclosed chamber and $NH_3$ dissolving back into the solution. The equilibrium will occur at a $NH_3$ gas pressure above normal atmospheric pressure, and it is for this reason that special apparatus is required for the liquid anisotropic etching method, that is capable of withstanding the pressure at equilibrium of $NH_3$ above the aqueous $NH_4OH$ solution, as well as the corrosive effects of $NH_3$.

Although it has been possible to perform liquid anisotropic etching of single crystal silicon using aqueous solutions of alkali metal hydroxides, TMAH, EDP and hydrazine, where for example the (111) crystallographic plane of silicon is etched at a slower rate compared to the (100) and (110) silicon planes, application of these etchants is very much limited due to the contaminating effects of the alkali metal cations to silicon dioxide in MOS and CMOS electronic device structures. For the case of TMAH, and especially EDP and hydrazine, the corrosive, carcinogenic and environmentally hazardous nature of the chemicals requires special safety precautions, making them costly to use. To date, no effective method with supporting apparatus, exists or has been described, for performing very high purity liquid anisotropic etching of silicon, suitable for electronic, optoelectronic and MEMS device applications while supporting etch rates comparable with the aforementioned existing anisotropic etchants and using instead, environmentally clean and minimally hazardous liquid anisotropic etchants. In contrast to the existing technology for liquid anisotropic etching of silicon using alkali metal hydroxides, TMAH, EDP and hydrazine, the versatile method and apparatus of the present invention supports the use of a very high purity aqueous $NH_4OH$ solution with elevated $NH_3$ pressure (overpressure) above the aqueous $NH_4OH$ solution, prepared at the point of use, from two pure precursors including distilled/deionized water held in a pure fluoropolymer (PTFE) material beaker and very high purity (99.9999%) semiconductor grade $NH_3$ reacting together in a specially designed and constructed corrosion resistant nickel alloy hermetic chamber, to form the very high purity aqueous $NH_4OH$ solution for liquid anisotropic etching of the silicon. The apparatus consisting of the specially designed and constructed corrosion resistant nickel alloy hermetic chamber, allows the aqueous $NH_4OH$ anisotropic etching solution to be heated to an optimal temperature between 70-90° C. to enable a high etching rate of the single crystal silicon or polycrystalline silicon, by preventing the ammonia from evaporating and escaping from the liquid anisotropic aqueous $NH_4OH$ etching solution. The byproducts of liquid anisotropic silicon etching according to the method of the present invention, include $NH_3$ gas and unreacted aqueous $NH_4OH$ solution containing consumed silicon hydroxides. These substances are environmentally friendly by virtue of being easy to neutralize and are minimally hazardous in contrast to TMAH, EDP, and hydrazine.

As illustrated in U.S. Pat. No. 6,787,052, the method proposed for deep etching of single crystal silicon wafers for fabrication of microstructures within the silicon relies on a first etching step using dry reactive ion etching (RIE) followed by a liquid anisotropic etching step using the well known in the art liquid anisotropic etchants, alkali metal hydroxides, tetramethylammonium hydroxide (TMAH), ethylene diamine pyrocatechol (EDP), gallic acid or hydrazine. The liquid anisotropic etching step of the described method for deep etching of single crystal silicon wafers, does not propose using high purity aqueous $NH_4OH$ solution generated at the point of use from ammonia gas dissolved into distilled/deionized water and maintained in equilibrium with an overpressure of ammonia, within a hermetically enclosed chamber at the optimal temperature required for etching between 70-90° C., preventing evaporation of $NH_3$ gas from aqueous $NH_4OH$ solution for achieving a high anisotropic etching rate.

As illustrated in U.S. Pat. No. 5,976,767, the method proposed for selectively etching polysilicon using ammonia solution or aqueous $NH_4OH$ is described, that is selective to silicon dioxide and photoresist. The exposed polysilicon gate which is usually deposited in thin layers of a few tens of nanometers on various substrates, is etched by the aqueous $NH_4OH$ solution having a 1-5% concentration by volume in water, and maintained at a low temperature between 20-30° C. The described etching method, although using aqueous $NH_4OH$ solution as the etchant, applies the technique to etching isotropically, only thin layers of polysilicon and is not appropriate for anisotropic etching of single crystal silicon having a thickness of several thousand nanometers. Moreover, the method, does not describe a solution or apparatus that enables increasing the anisotropic etch rate of single crystal silicon or polysilicon using high purity aqueous $NH_4OH$ solution generated at the point of use from ammonia gas dissolved into distilled/deionized water and maintained in equilibrium with an overpressure of ammonia, within a hermetically enclosed chamber at the optimal temperature required for etching between 70-90° C., preventing evaporation of $NH_3$ gas from aqueous $NH_4OH$ solution for achieving a high anisotropic etching rate.

As illustrated in U.S. Pat. No. 5,431,777, the method for crystallographically selective etching or anisotropic etching of silicon is presented in the presence of p-doped silicon where part of the silicon is dissolved, while a p-doped pattern in the surface remains largely undissolved. The anisotropic etchant composition of the described method that leaves p-doped silicon largely unetched consists of an aqueous solution of alkali metal hydroxide or tetraalkylammonium hydroxide and a high flashpoint alcohol, phenol, polymeric alcohol or polymeric phenol. The described anisotropic etching method for silicon, does not propose using high purity aqueous $NH_4OH$ solution generated at the point of use from ammonia gas dissolved into distilled/deionized water and maintained in equilibrium with an overpressure of ammonia, within a hermetically enclosed chamber at the optimal temperature required for etching between 70-90° C., preventing evaporation of $NH_3$ gas from aqueous $NH_4OH$ solution, for achieving a high anisotropic etching rate.

As illustrated in U.S. Pat. No. 5,296,093, the method for anisotropically etching a masked polysilicon layer formed over a step on an integrated circuit structure and having oxide portions is presented. The invention describes treating the integrated circuit structure after the polysilicon etch, with an aqueous ammonium-containing base mixed with peroxide solution to selectively remove the polymeric silicon/oxide-containing residues remaining after anisotropic etching of the polysilicon layer. The described anisotropic etching method for polysilicon does not propose using high purity aqueous $NH_4OH$ solution generated at the point of use from ammonia gas dissolved into distilled/deionized water and maintained in equilibrium with an overpressure of ammonia, within a hermetically enclosed chamber at the optimal temperature required for etching between 70-90° C., preventing evaporation of $NH_3$ gas from aqueous $NH_4OH$ solution, for achieving a high anisotropic etching rate.

As illustrated in U.S. Pat. No. 5,207,866, the method for anisotropically etching single crystal silicon is described by placing it in an etching solution consisting of $R_4NOH$ and solvent wherein R is an alkyl group having between 0 and 4 carbon atoms. The solution will preferentially etch <100> or <110> oriented single crystal silicon, additionally, electrochemical etching may be employed to preferentially etch p-type single crystal silicon. The described anisotropic etching method for single crystal silicon does not propose using high purity aqueous $NH_4OH$ solution generated at the point of use from ammonia gas dissolved into distilled/deionized water and maintained in equilibrium with an overpressure of ammonia, within a hermetically enclosed chamber at the optimal temperature required for etching between 70-90° C., to prevent evaporation of $NH_3$ gas from aqueous $NH_4OH$ solution, for achieving a high anisotropic etching rate.

As illustrated in U.S. Pat. No. 5,071,510, the method for electrochemical etching of silicon wafers or plates is described whereby the wafer front-side has a monocrystalline epitaxial layer having a doping type opposite to the remainder of the silicon wafer thereby forming a p/n junction. An organic photoresist film protects the epitaxial layer on the wafer front-side or epitaxy side so that the etchant composed of tetraalkylammonium hydroxide in water solution or in water-free form will etch the wafer back-side and a small voltage bias applied to the junction from the front-side assures an etch-stop at the p/n junction. The described anisotropic etching method for silicon wafers does not propose using high purity aqueous $NH_4OH$ solution generated at the point of use from ammonia gas dissolved into distilled/deionized water and maintained in equilibrium with an overpressure of ammonia, within a hermetically enclosed chamber at the optimal temperature required for etching between 70-90° C., to prevent evaporation of $NH_3$ gas from aqueous $NH_4OH$ solution, for achieving a high anisotropic etching rate.

As illustrated in U.S. Pat. No. 4,765,865, the method for increasing the etch rate of a single crystal silicon wafer in anisotropic etching solution by applying a masking layer to part of one face of the wafer and a metal coating to the other face of the wafer making the wafer more anodic than that of only a masked single crystal silicon wafer. Furthermore, an external potential can be applied to the masked and metalized wafer to increase the etching rate on the masked side as long as the potential is less than that which will cause the potential to exceed the passivation potential of a masked single crystal silicon wafer. The described anisotropic etching method for silicon wafers does not propose using high purity aqueous $NH_4OH$ solution generated at the point of use from ammonia gas dissolved into distilled/deionized water and maintained in equilibrium with an overpressure of ammonia, within a hermetically enclosed chamber at the optimal temperature required for etching between 70-90° C., to prevent evaporation of $NH_3$ gas from aqueous $NH_4OH$ solution, for achieving a high anisotropic etching rate.

As illustrated in U.S. Pat. No. 4,172,005, the method of etching a semiconductor substrate is described which comprises the steps of mounting a mask for etching on the semiconductor substrate and effecting crystallographically selective etching using an anisotropic etchant comprising an aqueous solution of 0.1-20% by weight of trihydrocarbon-substituted and tetrahydrocarbon-substituted ammonium hydroxide. Preferred are tetramethylammonium hydroxide, tetraethylammonium hydroxide, tetrapropylammonium hydroxide and tetrabutylammonium hydroxide. The described anisotropic etching method for semiconductor substrates does not propose using high purity aqueous $NH_4OH$ solution generated at the point of use from ammonia gas dissolved into distilled/deionized water and maintained in equilibrium with an overpressure of ammonia, within a hermetically enclosed chamber at the optimal temperature required for etching between 70-90° C., to prevent evaporation of $NH_3$ gas from aqueous $NH_4OH$ solution, for achieving a high anisotropic etching rate.

As illustrated in U.S. Pat. No. 4,137,123, the method of etching a textured surface into silicon is described using anisotropic etchant. The etchant provides a textured surface of randomly spaced and sized pyramids on a silicon surface and is composed of 0.5-10% by weight silicon and aqueous solutions of alkali metal hydroxides or ammonium hydroxide which optionally contains monohydric, dihydric or polyhydric alcohol where preferably solutions of potassium hydroxide containing isopropyl alcohol or ethylene glycol are employed. The described anisotropic etching method for silicon does not propose using high purity aqueous $NH_4OH$ solution generated at the point of use from ammonia gas dissolved into distilled/deionized water and maintained in equilibrium with an overpressure of ammonia, within a hermetically enclosed chamber at the optimal temperature required for etching between 70-90° C., to prevent evaporation of $NH_3$ gas from aqueous $NH_4OH$ solution, for achieving a high anisotropic etching rate.

As illustrated in U.S. Pat. No. 4,113,551, the method of etching polycrystalline silicon with aqueous solution of $NR_4OH$, where R is an alkyl group is described. Alternate etching solutions for the polycrystalline silicon may consist of aqueous solutions of $N(R_m)(H)_{4-m}OH$ where R is an alkyl group and m is an integer from zero to four, having a molar concentration in the range from 0.0001 moles to the solubility limit or also, aqueous solution of a monoamine selected from the group consisting of $R-NH_2$, $R_2NH$, $R_3N$, $R_aR_bNH$ and $(R_a)_2R_bN$, where R, $R_a$ and $R_b$ are alkyl functional groups and $R_a \neq R_b$. The described anisotropic etching method for polycrystalline silicon does not propose using high purity aqueous $NH_4OH$ solution generated at the point of use from ammonia gas dissolved into distilled/deionized water and maintained in equilibrium with an overpressure of ammonia, within a hermetically enclosed chamber at the optimal temperature required for etching between 70-90° C., to prevent evaporation of $NH_3$ gas from aqueous $NH_4OH$ solution, for achieving a high anisotropic etching rate.

As illustrated in U.S. Pat. No. 3,738,881, the method of anisotropically etching silicon and germanium is described using a novel etchant comprised of a strongly alkaline aqueous solution, an oxidizing agent, and a passivating alcohol. The etchant will etch germanium at a high rate with the same degree of geometry control as for silicon. The alkaline etchants proposed in the invention include alkali metal hydroxides such as sodium, potassium, rubidium and cesium hydroxide, as well as quarternary ammonium hydroxides. The described anisotropic etching method for silicon and germanium does not propose using high purity aqueous $NH_4OH$ solution generated at the point of use from ammonia gas dissolved into distilled/deionized water and maintained in equilibrium with an overpressure of ammonia, within a hermetically enclosed chamber at the optimal temperature required for etching between 70-90° C., to prevent evaporation of $NH_3$ gas from aqueous $NH_4OH$ solution, for achieving a high anisotropic etching rate.

Note that the above methods for anisotropically etching single crystal silicon or etching polycrystalline silicon do not envision, nor describe a method of using high purity aqueous $NH_4OH$ solution generated at the point of use from ammonia gas dissolved into distilled/deionized water and maintained in equilibrium with an overpressure of ammonia, within a hermetically enclosed chamber at the optimal temperature required for etching between 70-90° C., to prevent evaporation of $NH_3$ gas from aqueous $NH_4OH$ solution, for achieving a high anisotropic etching rate.

BRIEF SUMMARY OF THE INVENTION

The challenges associated with realizing a method of etching single crystal silicon anisotropically using a very clean, high purity etching process suitable for microelectronics, optoelectronics and microelectromechanical (MEMS) device fabrication in a microelectronics clean room setting, can be overcome by using high purity aqueous ammonium hydroxide ($NH_4OH$) solution generated at the point of use from high purity (99.9999%) semiconductor grade $NH_3$ gas dissolved into distilled/deionized water and maintained in equilibrium with an overpressure of ammonia, within a hermetically enclosed chamber at the optimal temperature required for etching between 70-90° C., to prevent evaporation of $NH_3$ gas from aqueous $NH_4OH$ solution, for achieving a high anisotropic etching rate. Etching silicon anisotropically with aqueous $NH_4OH$ solution at a high rate, requires the solution to be heated to between 70-90° C. Heating aqueous $NH_4OH$ anisotropic etching solution to the optimal 70-90° C. temperature required for high rate anisotropic etching of silicon, cannot be achieved in the open atmosphere due to the resulting increase in the vapor pressure and evaporation rate of $NH_3$ gas from the aqueous $NH_4OH$ solution, thereby, quickly reducing the concentration of $NH_4OH$ in aqueous solution to very low levels, which slows and eventually stops altogether the etching action. To prevent the loss through evaporation of dissolved $NH_3$ gas from $NH_4OH$ solution at the etching temperature, the aqueous $NH_4OH$ anisotropic etching solution must be enclosed hermetically inside a pressure vessel having fixed volume and fabricated from corrosion resistant material capable of withstanding the effects of hot $NH_3$ gas, mixed with water vapor. Most stainless steel materials such as grade 302, 303 and 304 will become corroded, therefore, nickel based alloys Inconel 600, C-276 and Nickel 200 or 201 should be used in the construction of apparatus that will support such etching method of the present invention. By maintaining an overpressure of $NH_3$ gas above the aqueous $NH_4OH$ solution at the etching temperature, a favorable equilibrium steady state condition can be attained at the etching temperature (70-90° C.) with the rate of evaporation of $NH_3$ gas from aqueous $NH_4OH$ solution equal to the rate of $NH_3$ gas dissolving back into the aqueous $NH_4OH$ solution described by Henry's law. The $NH_3$ gas overpressure above aqueous $NH_4OH$ anisotropic etching solution will depend on the concentration of $NH_3$ required in solution for the anisotropic etching application and will usually not exceed between 1-4 atmospheres at the etching temperature of 70-90° C.

The specialized method and supporting apparatus is described herein that was developed specifically to allow high purity aqueous $NH_4OH$ anisotropic etching solution for silicon, to be prepared at the point of use, having any required concentration, spanning the full range of possible concentrations from dilute to fully saturated aqueous $NH_4OH$ anisotropic etching solution for silicon. The preferred embodiment of the apparatus consists of a corrosion resistant Inconel 600, nickel alloy hermetic chamber having fixed volume ranging between 2-4 Liters or larger, depending on the diameter of the silicon wafers that must be processed, and having walls sufficiently thick to withstand the pressure of 1-4 atmospheres at the etching temperature of 70-90° C. Such hermetic vessel has a polytetrafluoroethylene (PTFE) liner to contain the liquid form, aqueous $NH_4OH$ solution used to anisotropically etch the silicon. The vessel possesses an external electric ring heater at the base of the unit that allows the correct temperature for the aqueous $NH_4OH$ solution to be set. A mechanical arm with built in thermocouple well containing a thermocouple or RTD sensor and supported by a flexible bellows, provides a means to lower and raise the silicon wafer into the aqueous $NH_4OH$ etching solution. A gas inlet/outlet port allows the vessel to be evacuated as well as allows $NH_3$ gas to be delivered at the appropriate pressure into the vessel to be dissolved into distilled/deionized $H_2O$ contained in the PTFE liner, to form the aqueous $NH_4OH$ anisotropic etching solution having the required concentration.

A normal operating procedure for the apparatus supporting the anisotropic etching method of the present invention for silicon, begins when distilled/deionized water is introduced to the PTFE liner within the Inconel 600 etch reactor vessel. The wafer is loaded into the etching reactor vessel and lowered into the distilled/deionized water held in the PTFE liner. The vessel is sealed and first evacuated by removing the air with a pump. Subsequently, the water temperature is raised to between 70-90° C. The high purity (99.9999%) semiconductor grade $NH_3$ gas is introduced to the chamber either using a pressure regulator or alternatively, with a mass flow controller to form the precise concentration aqueous $NH_4OH$ solution needed for anisotropically etching the silicon at the required rate. After the correct amount of time for the anisotropic etching has elapsed, the silicon wafer is raised from the etching solution, thereby stopping the etch. The vessel is vented to release the $NH_3$ gas overpressure and the wafer can be extracted from the vessel and rinsed in preparation for its next fabrication processing step.

In summary, the principal advantages of the anisotropic etching method of the present invention include first and foremost a cleanliness level of the process that surpasses the other existing methods using other types of liquid etchants for performing high rate anisotropic etching of silicon. For example, etching silicon anisotropically with tetramethylammonium hydroxide (TMAH), currently regarded as one of the cleanest and least contaminating anisotropic etching methods for silicon, still poses a risk of contamination to silicon due to its carbon content. By contrast, the anisotropic etching method described in the present invention uses aqueous $NH_4OH$ solution generated directly at the point of use from the a gaseous precursor $NH_3$ and distilled/deionized $H_2O$. In contrast to TMAH, the $NH_3$ gas and $H_2O$ precursors of $NH_4OH$ etchant eliminate risk for solid residues to be deposited on the silicon due to being composed entirely of elements having a gaseous form at room temperature. Both $NH_3$ gas and $H_2O$ are available at reasonable cost in very high purity, exceeding the highest purity grades available for TMAH. For sensitive, high performance microelectronic and optoelectronic device fabrication in silicon foundry cleanrooms, purity of etchants and chemicals used to process silicon is paramount, together with ease of use. The anisotropic etching method for silicon described in the present invention, using aqueous $NH_4OH$, generated at the point of use, provides the very high degree of purity required, together with ease of use which includes zero generation of chemical byproducts hazardous to humans or the environment.

BRIEF DESCRIPTION OF THE SEVERAL VIEWS OF THE DRAWING

These and other features of the subject of the invention will be better understood with connection with the Detailed Description of the Invention in conjunction with the Drawings, of which.

DETAILED DESCRIPTION OF THE INVENTION

Figure 1:
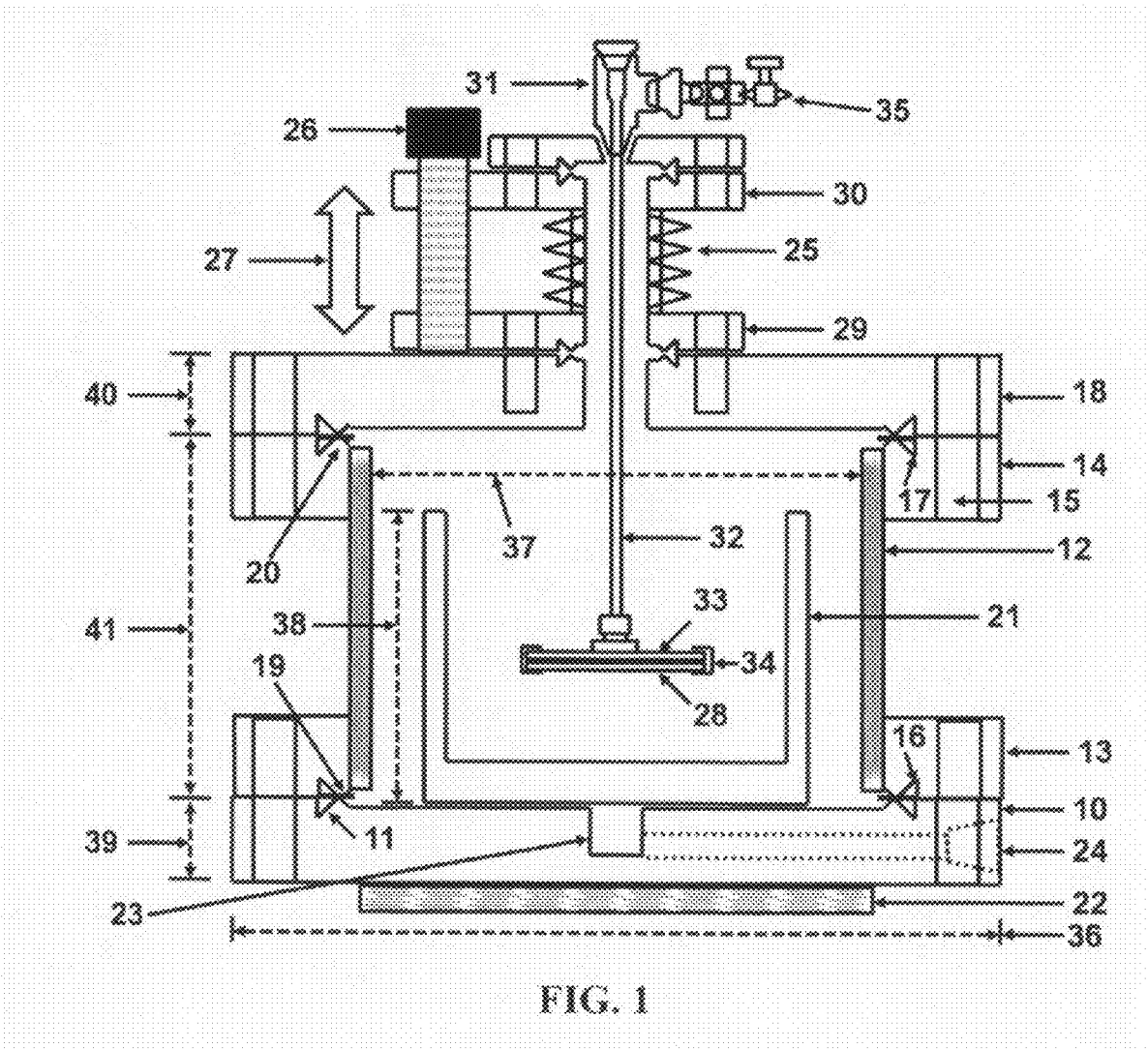
FIG. 1 illustrates the method and apparatus for etching silicon anisotropically using aqueous $NH_4OH$ solution generated at the point of use inside a hermetically enclosed nickel alloy pressure vessel by dissolving $NH_3$ gas in distilled/deionized water.

Referring to FIG. 1, a depiction of the hermetically sealed, nickel alloy pressure vessel is shown in a non-scale rendering to be used for liquid anisotropic etching of silicon or etching of polycrystalline silicon using high purity aqueous ammonium hydroxide ($NH_4OH$) solution generated at the point of use or in advance of use, from high purity (99.9999%), semiconductor grade ammonia $NH_3$ gas dissolved into distilled/deionized water and maintained in equilibrium with an overpressure of $NH_3$, within a hermetically enclosed chamber at the optimal temperature between 70-90° C., preventing evaporation of $NH_3$ gas from aqueous $NH_4OH$ solution for achieving a high anisotropic etching rate. The nickel alloy pressure vessel consists of a flange base plate 10, manufactured from corrosion resistant nickel alloy such as Inconel 600 or Nickel 200, having a knife edge 11, that allows the base plate flange to be sealed hermetically using an inert fluoropolymer o-ring for example, to the main pressure vessel body 12, also manufactured from corrosion resistant nickel alloy such as Inconel 600 or Nickel 200. The main body 12, of the nickel alloy pressure vessel is characterized by having two end flanges 13 & 14 with bolt holes 15 arranged in a circular pattern, connected by a seamless pipe extension body 12, where both end flanges are characterized by having knife edges 16 & 17, that allow sealing the pressure vessel hermetically using a base flange 10, and a top cover flange 18 using fluoropolymer o-rings 19 & 20 respectively. The main pressure vessel body 12, with two end flanges 13 & 14, can be manufactured from a single section of drawn seamless Inconel 600 or Nickel 200 pipe, which is machined to proper form through a succession of lathe and milling operations, thereby providing unparalleled strength and seal integrity as opposed to for example, welding the two end flanges 13 & 14 to the pipe shaped body 12.

A liner 21 manufactured from the chemically inert material, polytetrafluoroethylene (PTFE) which tolerates temperatures of up to 250° C., is used to contain the high purity liquid anisotropic etching solution of $NH_4OH$ which is generated either at the point of use for etching of silicon or in advance of the etching procedure. The $NH_4OH$ anisotropic etching solution is heated using a heating element in the shape of a ring 22, affixed to the exterior wall of the base plate flange 10 of the etching reactor pressure vessel. Mounting the ring heater on the exterior wall of the base plate flange 10 of the pressure vessel as opposed to using an immersion type heater suspended directly in the anisotropic etching solution, helps preserve the purity of the $NH_4OH$ etching solution. The base flange 10, design is also characterized by having a drain hole 23, in the interior center of the plate, drilled to a depth half way down into the thickness of the flange 10, together with a cross-drilled channel with a female pipe thread connection 24, to facilitate collection and removal of any recondensed ammonia water vapor ($NH_4OH$) outside the PTFE liner 21, between the exterior walls of the PTFE liner 21 and the walls of the pressure vessel 12.

A mechanism for controlling the precise start and stop times of the anisotropic etching process for the silicon is shown, whereby, a bellows assembly 25 fabricated either from the corrosion resistant Inconel 600 or Nickel 200 materials together with a supporting mechanical assembly 26, is used to lower and raise 27 the silicon wafer substrate 28 into and out of the aqueous $NH_4OH$ anisotropic etching solution. The flexible bellows assembly 25 is welded in between a lower flange plate 29 with knife edge and upper flange plate 30 also with knife edge. The lower flange plate 29 is hermetically sealed to the top flange plate 18 of the etching reactor pressure vessel.

A plumbing assembly 31, also fabricated from corrosion resistant Inconel 600 or Nickel 200 materials supports a thermocouple or RTD temperature sensor well 32, which has been modified to enable mounting of a susceptor or plate 33 of equal or slightly larger diameter than the wafer substrate that allows the silicon wafer substrate 28 to be mounted loosely to its face using clips 34.

The plumbing assembly 31 contains an inlet valve having a positive shut off capability 35 and fabricated from corrosion resistant Inconel 600 or Nickel 200 material, for evacuation of the etch reactor pressure vessel 12 volume as well as for admitting compressed, high purity (99.9999%) semiconductor grade $NH_3$ gas into the interior of the etch reactor pressure vessel.

The outer diameter 36 as well as the inner diameter 37 of the pressure vessel is determined according to the size or diameter of the silicon wafer substrate 28. To allow for example 2", 3" and 4" diameter silicon wafer substrates to be anisotropically etched in the said etch reactor, a flange outer diameter 36 of 6.75" will be adequate with an inner diameter 37 of 5". The height of the PTFE liner 38 can be on the order 6" while the bottom flange thickness 39 and top flange thickness 40 is on the order of 1". The height of the main pressure vessel body 41, can be on the order of 8-12". If the silicon wafer diameter will be 6" or larger, then all the relevant dimensions which primarily include the etch reactor vessel outer and inner diameters 36 & 37 respectively, must be enlarged and sized appropriately to accommodate the increased diameter of the silicon wafer substrates 28.

The preferred embodiment of the anisotropic etching reactor for silicon shown in FIG. 1 is meant to be operated by generating the high purity aqueous $NH_4OH$ anisotropic etching solution at the point of use, to be maintained in equilibrium with an overpressure of $NH_3$, within the hermetically enclosed chamber at the optimal temperature between 70-90° C., preventing evaporation of $NH_3$ gas from aqueous $NH_4OH$ solution for achieving a high anisotropic etching rate. Although the aqueous $NH_4OH$ anisotropic etching solution can also be generated well in advance of the silicon etching operation using the apparatus of the present invention shown in FIG. 1, it is advantageous to generate it at the time and point of use by dissolving high purity (99.9999%) semiconductor grade $NH_3$ gas into distilled/deionized water contained in the PTFE liner 21 in the pressure vessel, in order to reduce the possibility of contamination of the liquid $NH_4OH$ anisotropic etching solution and consequently the silicon material being etched, due to prolonged storage of the etchant before being used. The etching reactor is meant to be operated by first opening and removing the top flange cover 18 of etching reactor pressure vessel. The PTFE liner 21 is filled with distilled/deionized water and a silicon wafer substrate 28 is attached with clips 34, to the susceptor or plate 33. The top cover flange 18, is sealed back hermetically to the main pressure vessel body 12. The silicon wafer 28 is lowered 27 into the distilled/deionized water using the mechanical apparatus 26 of the flexible bellows assembly 25 thereby also allowing the RTD contained in the thermowell 32 to sense the temperature of the distilled/deionized water. The electric heater 22 is turned on and the temperature of the distilled/deionized water is set between 70-90° C. using a temperature controller. Once a stable operating temperature between 70-90° C. has been reached, the air from the pressure vessel of the etching reactor 12 is evacuated using a vacuum pump via the valve 35, followed by the introduction of high purity (99.9999%) semiconductor grade $NH_3$ gas using either a pressure regulator or mass flow controller. The $NH_3$ gas metered into the etch reactor pressure vessel partially dissolves into the destilled/deionized water to produce the $NH_4OH$ anisotropic etching solution of known concentration and fixed 70-90° C. temperature, maintained in equilibrium with an overpressure of $NH_3$, within the hermetically enclosed chamber, for achieving a known rate of silicon removal. After the predetermined etching time for the silicon substrate 28, has elapsed, the etching action can be stopped rapidly by raising 27 the silicon substrate 28 from the aqueous $NH_4OH$ anisotropic etching solution using the mechanical apparatus 26 with flexible bellows 25, followed by turning off the power to the heater 22. The $NH_3$ gas overpressure can subsequently be vented via the valve 35, and the top flange plate 18, removed to recover the etched silicon substrate 28.

Figure 2:
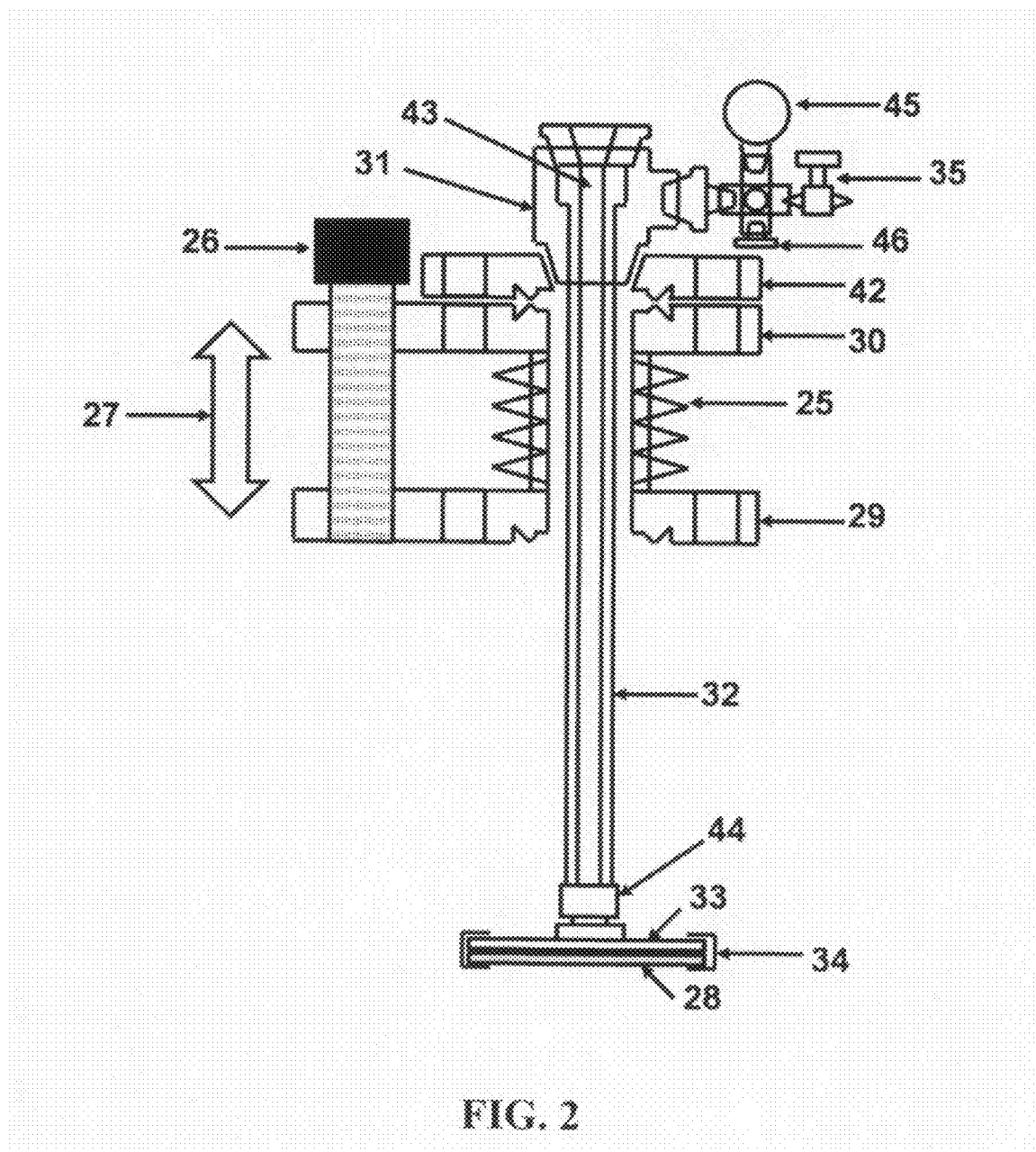
FIG. 2 illustrates the apparatus that is used to raise and lower the silicon wafer substrate into the aqueous $NH_4OH$ etching solution together with plumbing fittings including pressure gauge, overpressure safety check valve and $NH_3$ gas inlet valve.

Referring to FIG. 2, a detailed depiction of the mechanical assembly 26, used to lower and raise 27 the silicon wafer substrate 28 into and out of the aqueous $NH_4OH$ anisotropic etching solution is shown. A flexible and variable length bellows assembly 25 fabricated either from the corrosion resistant Inconel 600 or Nickel 200 materials together with a supporting mechanical assembly 26, is used to lower and raise 27 the silicon wafer substrate 28 into and out of the aqueous $NH_4OH$ anisotropic etching solution. The flexible bellows assembly 25 is welded in between a lower flange plate 29 with knife edge and upper flange plate 30 also with knife edge. A nickel alloy flange with knife edge for hermetic sealing 42, caps the top flange 30 of the bellows assembly and supports a female pipe thread in the center which supports a plumbing type Inconel 600 or Nickel 200 street-T fitting 31, into which is threaded a modified thermocouple/RTD well 32, that has a hollow interior channel 43, for installing the thermocouple or RTD. A compression fitting 44 mounts to the bottom of the thermocouple well 32 to support a susceptor or plate 33 having the same or slightly larger diameter than the silicon wafer substrate 28 which is held loosely to the plate with clips 34. Further plumbing hardware is attached to the street-T fitting 31, near the top of the mechanical assembly including a pressure gauge 45 that indicates the pressure inside the etching reactor chamber of $NH_3$ gas in equilibrium, above the aqueous $NH_4OH$ liquid anisotropic etching solution. The safety check valve 46 provides an emergency relief to vent excess $NH_3$ gas should the $NH_3$ gas pressure inside the vessel somehow begin to exceed safe limits beyond 4-5 atmospheres.

The manual valve 35, serves to allow the etch reactor pressure vessel to be evacuated prior to introducing high purity (99.9999%) semiconductor grade $NH_3$ gas for dissolving into the distilled/deionized water to form the high purity aqueous $NH_4OH$ anisotropic etching solution for silicon.

Figure 3:
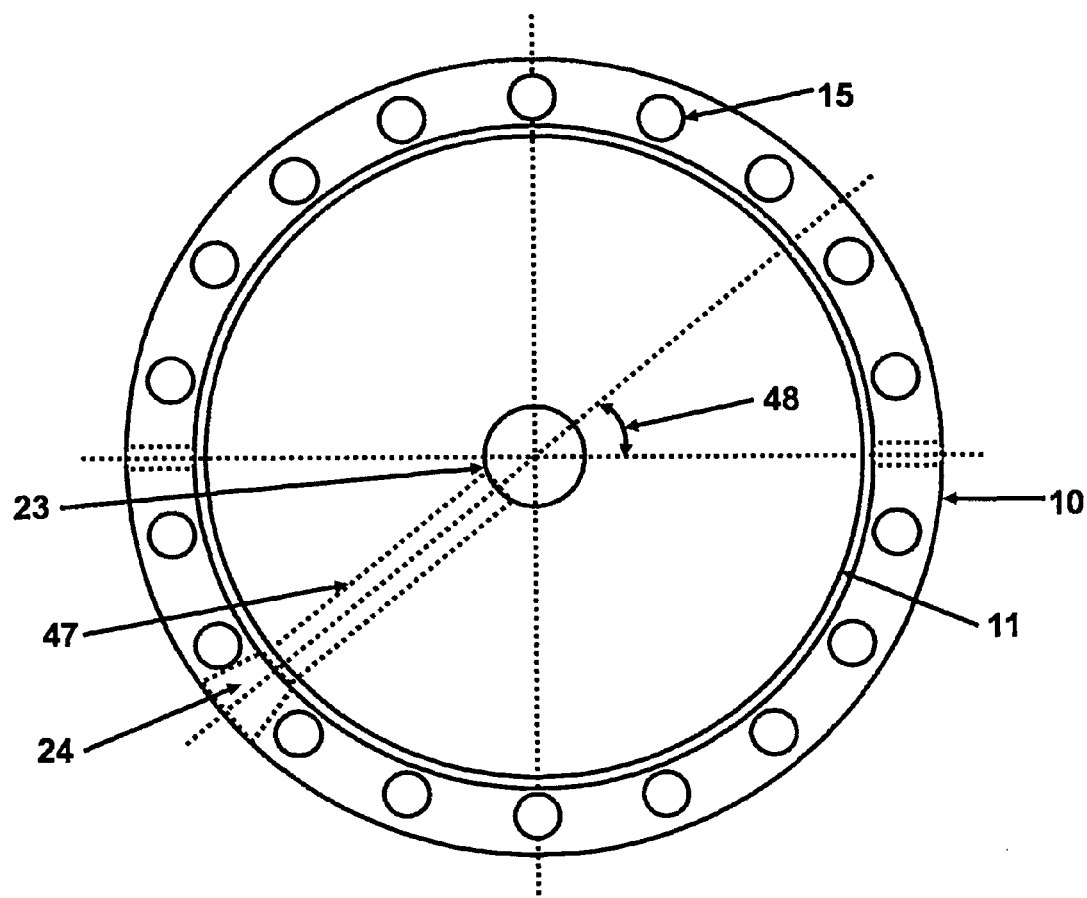
FIG. 3 illustrates the drainage system detail in the base flange of the nickel alloy pressure vessel, for recondensed ammonia water vapor ($NH_4OH$) outside the PTFE liner, between the exterior walls of the PTFE liner and the walls of the pressure vessel.

Referring to FIG. 3, a detailed depiction of the interior or knife edge face of the base or bottom flange 10 of the etching reactor pressure vessel is shown. The flange 10 is manufactured from Inconel 600 or Nickel 200 corrosion resistant material. The bolt holes 15 are arranged in a circular pattern around a machined knife edge 11. The center of the flange 10 has a machined drain hole 23, drilled to a depth halfway down into the flange with a drilled cross channel 47 that intersects the drain hole 23. The cross channel 47 has a machined female pipe thread at the outlet 24, for attaching a drain valve to facilitate collection and removal from the pressure vessel of any recondensed ammonia water vapor ($NH_4OH$) outside the PTFE liner, between the exterior walls of the PTFE liner and the walls of the pressure vessel. The angle 48 of the drilled cross-channel 47 relative to the horizontal reference line is shown to be 40 degrees.

Figure 4:
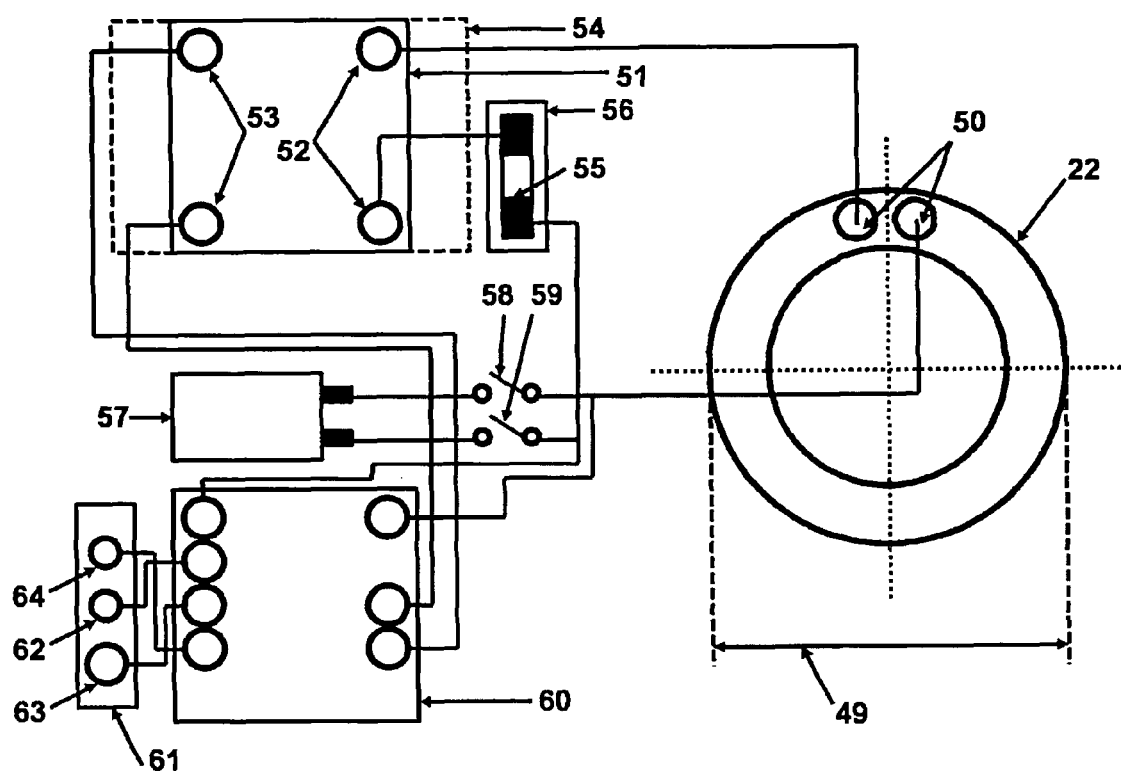
FIG. 4 illustrates the electrical system of the etching apparatus including the ring heater mounted on the base flange of the nickel alloy pressure vessel, temperature controller and RTD input block.

Referring to FIG. 4, a depiction of the silicon etch reactor temperature control apparatus with power distribution circuitry for the electric heater is shown. The electric ring shaped heater 22 has a diameter 49 slightly smaller than the diameter of the bottom flange of the etch reactor pressure vessel. The ring heater 22 has two power terminals 50 for supplying electric current to the heater element that warms the aqueous $NH_4OH$ etching solution. A solid-state relay 51 having two output terminals 52 and two input terminals 53 is mounted on a heat sink 54, and controls the current delivered at 120 Volts AC to the ring heater 22. A fuse 55 mounted on a fuse block 56 provides protection from overcurrents or other types of faults that may develop in the electric heater circuit. A standard computer receptacle 57, allows a standard computer power cord to be used to connect to a 120 VAC power outlet. Two circuit breakers 58 and 59 provide on/off switching capability for the line and neutral return respectively. A temperature controller 60 takes an input from an RTD or thermocouple element that senses the temperature of the aqueous $NH_4OH$ anisotropic etching solution, and is plugged into the RTD receptacle 61 shown which is connected to the temperature controller 60. The standard RTD receptacle 61 has three terminals for red wire (positive) 62, black wire (negative) 63, and a second black wire for ground 64. The temperature controller 60 receives its power from a 120 VAC circuit provided from the receptacle 57 and in turn provides electronic control signals 53 to the solid-state relay 51, in order to tune the flow of current to the ring heater 22.

In summary, a novel method and apparatus for implementing very high purity, anisotropic etching of silicon wafer substrates and etching of polycrystalline silicon has been described for application to microelectronics, optoelectronics and microelectromechanical (MEMS) device fabrication, using high purity, aqueous ammonium hydroxide ($NH_4OH$) solution generated at the point of use, from high purity (99.9999%), semiconductor grade ammonia $NH_3$ gas dissolved into distilled/deionized water and maintained in equilibrium with an overpressure of $NH_3$, within a hermetically enclosed chamber at the optimal temperature between 70-90° C., preventing evaporation of $NH_3$ gas from aqueous $NH_4OH$ solution for achieving a high anisotropic etching rate.

The invention claimed is:

1. A method for liquid anisotropically etching a single crystal silicon semiconductor wafer substrate for, optoelectronic devices using ammonium hydroxide ($NH_4OH$) anisotropic etching solution generated directly at the immediate time and point of use by chemically reacting semiconductor grade deionized water ($H_2O$) with semiconductor grade ammonia ($NH_3$) gas to form said ammonium hydroxide ($NH_4OH$) anisotropic etching solution, whereby (111 ) planes of said single crystal silicon semiconductor wafer substrate are etched more slowly than (100) planes of said single crystal silicon semiconductor wafer substrate, comprising the steps of:

immersing said single crystal silicon semiconductor wafer substrate into only said semiconductor grade deionized water ($H_2O$), wherein said semiconductor grade deionized water ($H_2O$) is contained within an inert liner and wherein said inert liner is contained within a hermetically sealed pressure chamber, said hermetically sealed pressure chamber comprising a base plate flange coupled to said inert liner; and setting an optimal temperature of said semiconductor grade deionized water ($H_2O$), wherein said semiconductor grade deionized water ($H_2O$) remains in a liquid state contained within said inert liner and wherein said optimal temperature of said semiconductor grade deionized water ($H_2O$) is provided by an electric heater coupled to the exterior surface of said base plate flange; and introducing said semiconductor grade ammonia ($NH_3$) gas into said hermetically sealed pressure chamber at higher than atmospheric pressure, wherein said semiconductor grade ammonia ($NH_3$) gas chemically reacts with said semiconductor grade deionized water ($H_2O$) contained within said inert liner, thereby forming said ammonium hydroxide ($NH_4OH$) anisotropic etching solution, and wherein said semiconductor grade ammonia ($NH_3$) gas overpressure above said ammonium hydroxide ($NH_4OH$) anisotropic etching solution prevents evaporation of said semiconductor grade ammonia ($NH_3$) gas in said ammonium hydroxide ($NH_4OH$) anisotropic etching solution according to Henry's law; and etching away silicon anisotropically from the surface of said single crystal silicon semiconductor wafer substrate immersed in said ammonium hydroxide ($NH_4OH$) anisotropic etching solution; and withdrawing said single crystal silicon semiconductor wafer substrate from said ammonium hydroxide ($NH_4OH$) anisotropic etching solution immediately after completion of said liquid anisotropic etching.

2. A method according to claim 1 in which said optimal temperature for said ammonium hydroxide ($NH_4OH$) anisotropic etching solution is greater than 70 degrees and less than 90 degrees Celsius.

3. A method according to claim 1 in which said semiconductor grade ammonia ($NH_3$) gas is introduced into said hermetically sealed pressure chamber using a pressure regulator or mass flow controller.

4. A method according to claim 1 in which said semiconductor grade ammonia ($NH_3$) gas overpressure above said ammonium hydroxide ($NH_4OH$) anisotropic etching solution is greater than 1 atmosphere and less than 4 atmospheres.

5. A method according to claim 1 in which said semiconductor grade ammonia ($NH_3$) gas purity is 99.9999%.

6. A method according to claim 1 in which said hermetically sealed pressure chamber comprises Inconel 600 alloy or Nickel 200.

7. A method according to claim 1 in which said inert liner comprises polytetrafluoroethylene (PTFE).

8. A method according to claim 1 in which said single crystal silicon semiconductor wafer substrate is immersed into said semiconductor grade deionized water ($H_2O$) or withdrawn from said ammonium hydroxide ($NH_4OH$) anisotropic etching solution using a flexible bellows assembly, said flexible bellows assembly permitting lowering of said single crystal silicon semiconductor wafer substrate into said semiconductor grade deionized water ($H_2O$) and raising of said single crystal silicon semiconductor wafer substrate out of said ammonium hydroxide ($NH_4OH$) anisotropic etching solution.

9. A method according to claim 1 in which said semiconductor grade deionized water ($H_2O$) and said ammonium hydroxide ($NH_4OH$) anisotropic etching solution are heated using said electric heater, wherein said electric heater is a ring heater.

* * * * *